(12) United States Patent
Zeghidour et al.

(10) Patent No.: US 11,600,282 B2
(45) Date of Patent: Mar. 7, 2023

(54) COMPRESSING AUDIO WAVEFORMS USING NEURAL NETWORKS AND VECTOR QUANTIZERS

(71) Applicant: Google LLC, Mountain View, CA (US)

(72) Inventors: Neil Zeghidour, Paris (FR); Marco Tagliasacchi, Kilchberg (CH); Dominik Roblek, Meilen (CH)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/856,856

(22) Filed: Jul. 1, 2022

(65) Prior Publication Data

US 2023/0019128 A1    Jan. 19, 2023

Related U.S. Application Data

(60) Provisional application No. 63/218,139, filed on Jul. 2, 2021.

(51) Int. Cl.
| | |
|---|---|
| *G10L 19/038* | (2013.01) |
| *G10L 25/30* | (2013.01) |
| *G10L 19/00* | (2013.01) |
| *G06N 3/08* | (2023.01) |
| *G06N 3/04* | (2023.01) |

(52) U.S. Cl.
CPC .......... *G10L 19/038* (2013.01); *G06N 3/0454* (2013.01); *G06N 3/08* (2013.01); *G10L 25/30* (2013.01); *G10L 2019/0002* (2013.01)

(58) Field of Classification Search
CPC .............................. G10L 19/038; G10L 25/30; G10L 2019/0002
See application file for complete search history.

(56) References Cited

U.S. PATENT DOCUMENTS

| | | | | |
|---|---|---|---|---|
| 5,819,215 A | * | 10/1998 | Dobson | ................... G06T 9/007 |
| 6,952,671 B1 | * | 10/2005 | Kolesnik | ................. G10L 19/07 |
| | | | | 704/E19.025 |

(Continued)

OTHER PUBLICATIONS

Barnes et al., "Advances in Residual Vector Quantization: A Review," IEEE Transactions on Image Processing, Feb. 1996, 5(2):226-262.

(Continued)

*Primary Examiner* — Kevin Ky
(74) *Attorney, Agent, or Firm* — Fish & Richardson P.C.

(57) ABSTRACT

Methods, systems and apparatus, including computer programs encoded on computer storage media. One of the methods includes receiving an audio waveform that includes a respective audio sample for each of a plurality of time steps, processing the audio waveform using an encoder neural network to generate a plurality of feature vectors representing the audio waveform, generating a respective coded representation of each of the plurality of feature vectors using a plurality of vector quantizers that are each associated with a respective codebook of code vectors, wherein the respective coded representation of each feature vector identifies a plurality of code vectors, including a respective code vector from the codebook of each vector quantizer, that define a quantized representation of the feature vector, and generating a compressed representation of the audio waveform by compressing the respective coded representation of each of the plurality of feature vectors.

20 Claims, 9 Drawing Sheets

(56) References Cited

U.S. PATENT DOCUMENTS

| | | | | |
|---|---|---|---|---|
| 11,483,646 | B1* | 10/2022 | Pan | H04R 1/406 |
| 2003/0204394 | A1* | 10/2003 | Garudadri | G10L 15/32 |
| | | | | 704/E15.049 |
| 2010/0023336 | A1* | 1/2010 | Shmunk | G10L 19/0212 |
| | | | | 704/503 |
| 2015/0332690 | A1* | 11/2015 | Kim | G10L 19/038 |
| | | | | 704/222 |
| 2017/0251212 | A1* | 8/2017 | Swaminathan | H04N 19/94 |
| 2018/0114522 | A1* | 4/2018 | Hall | G10L 13/047 |
| 2018/0249160 | A1* | 8/2018 | Zhao | H04N 19/94 |
| 2019/0121883 | A1* | 4/2019 | Swaminathan | G06F 16/2365 |
| 2019/0121884 | A1* | 4/2019 | Swaminathan | H03M 7/30 |
| 2020/0175961 | A1* | 6/2020 | Thomson | G10L 15/28 |
| 2020/0234725 | A1 | 7/2020 | Garbacea et al. | |
| 2022/0335963 | A1* | 10/2022 | Jang | G10L 25/30 |

OTHER PUBLICATIONS

Invitation to Pay Additional Fees in International Appln. No. PCT/US2022/036097, dated Oct. 19, 2022, 11 pages.

Baevski et al., "wav2vec 2.0: A framework for self-supervised learning of speech representations," Advances in Neural Information Processing Systems 33, 2020, 12 pages.

Bessette et al., "The adaptive multirate wideband speech codec (AMR-WB)," IEEE Transactions on Speech and Audio Processing, Nov. 2002, 10(8):620-636.

Biswas et al., "Audio Codec Enhancement with Generative Adversarial Networks," ICASSP 2020—2020 IEEE International Conference on Acoustics, Speech and Signal Processing (ICASSP), May 2020, pp. 356-360.

Blau et al., "The Perception-Distortion Tradeoff," Proceedings of the IEEE Conference on Computer Vision and Pattern Recognition (CVPR), Jun. 2018, pp. 6228-6237.

Casebeer et al., "Enhancing into the Codec: Noise Robust Speech Coding with Vector-Quantized Autoencoders," ICASSP 2021—2021 IEEE International Conference on Acoustics, Speech and Signal Processing (ICASSP), Jun. 2021, pp. 711-715.

Chinen et al., "ViSQOL v3: An Open Source Production Ready Objective Speech and Audio Metric," 2020 Twelfth International Conference on Quality of Multimedia Experience (QoMEX), May 2020, 6 pages.

Clevert et al., "Fast and Accurate Deep Network Learning by Exponential Linear Units (ELUs)," arXiv, Dec. 3, 2015, 14 pages.

Dhariwal et al., "Jukebox: A Generative Model for Music," arXiv, Apr. 30, 2020, 20 pages.

Dieleman et al., "The challenge of realistic music generation: modelling raw audio at scale," Advances in Neural Information Processing Systems 31, 2018, 11 pages.

Dietz et al., "Overview of the EVS codec architecture," 2015 IEEE International Conference on Acoustics, Speech and Signal Processing (ICASSP), Apr. 2015, pp. 5698-5702.

Donahue et al., "Exploring Speech Enhancement with Generative Adversarial Networks for Robust Speech Recognition," 2018 IEEE International Conference on Acoustics, Speech and Signal Processing (ICASSP), Apr. 2018, pp. 5024-5028.

Engel et al., "DDSP: Differentiable Digital Signal Processing," arXiv, Jan. 14, 2020, 19 pages.

Feng et al., "Speech feature denoising and dereverberation via deep autoencoders for noisy reverberant speech recognition," 2014 IEEE International Conference on Acoustics, Speech and Signal Processing (ICASSP), May 2014, pp. 1759-1763.

Fonseca et al., "Freesound datasets: A platform for the creation of open audio datasets," Proceedings of the 18th ISMIR Conference, Oct. 2017, pp. 486-493.

Garbacea et al., "Low Bit-rate Speech Coding with VQ-VAE and a WaveNet Decoder," ICASSP 2019—2019 IEEE International Conference on Acoustics, Speech and Signal Processing (ICASSP), May 2019, pp. 735-739.

Germain et al., "Speech Denoising with Deep Feature Losses," arXiv, Sep. 14, 2018, 6 pages.

Gray, "Vector quantization," IEEE ASSP Magazine, Apr. 1984, 1(2):4-29.

Gritsenko et al., "A Spectral Energy Distance for Parallel Speech Synthesis," Advances in Neural Information Processing Systems 33, 2020, 11 pages.

Hines et al., "ViSQOL: The Virtual Speech Quality Objective Listener," IWAENC 2012; International Workshop on Acoustic Signal Enhancement, Sep. 2012, 4 pages.

Holmberg et al., "Web real-time communication use cases and requirements," IETF RFC 7478, Mar. 2015, 29 pages.

International Telecommunication Union (ITU), "Recommendation ITU-R BS.1534-1: Method for the subjective assessment of intermediate quality level of coding systems," Mar. 31, 2003, 18 pages.

Ishii et al., "Reverberant Speech Recognition Based on Denoising Autoencoder," Interspeech, Aug. 2013, pp. 3512-3516.

Jin et al., "FFTNet: A Real-Time Speaker-Dependent Neural Vocoder," 2018 IEEE International Conference on Acoustics, Speech and Signal Processing (ICASSP), Apr. 2018, pp. 2251-2255.

Juang et al., "Multiple stage vector quantization for speech coding," ICASSP '82. IEEE International Conference on Acoustics, Speech, and Signal Processing, May 1982, 7:597-600.

Kalchbrenner et al., "Efficient Neural Audio Synthesis," Proceedings of the 35th International Conference on Machine Learning, 2018, 10 pages.

Kankanahalli et al., "End-To-End Optimized Speech Coding with Deep Neural Networks," 2018 IEEE International Conference on Acoustics, Speech and Signal Processing (ICASSP), Apr. 2018, pp. 2521-2525.

Kleijn et al., "Generative Speech Coding with Predictive Variance Regularization," arXiv, Feb. 18, 2021, 5 pages.

Kleijn et al., "Wavenet Based Low Rate Speech Coding," 2018 IEEE International Conference on Acoustics, Speech and Signal Processing (ICASSP), Apr. 2018, pp. 676-680.

Kong et al., "HiFi-GAN: Generative Adversarial Networks for Efficient and High Fidelity Speech Synthesis," Advances in Neural Information Processing Systems 33, 2020, 12 pages.

Kumar et al., "MelGAN: Generative Adversarial Networks for Conditional Waveform Synthesis," Advances in Neural Information Processing Systems 32, 2019, 12 pages.

Law et al., "Evaluation of algorithms using games: The case of music tagging," 10th International Society for Music Information Retrieval Conference (ISMIR), 2009, pp. 387-392.

Li et al., "Real-Time Speech Frequency Bandwidth Extension," ICASSP 2021—2021 IEEE International Conference on Acoustics, Speech and Signal Processing (ICASSP), Jun. 2021, pp. 691-695.

Lim et al., "Time-Frequency Networks for Audio Super-Resolution," 2018 IEEE International Conference on Acoustics, Speech and Signal Processing (ICASSP), Apr. 2018, pp. 646-650.

Linde et al., "An Algorithm for Vector Quantizer Design," IEEE Transactions on Commumcations, Jan. 1980, 28(1):84-95.

Lloyd, "Least squares quantization in PCM," IEEE Transactions on Information Theory, Mar. 1982, 28(2):129-137.

MacQueen, "Some methods for classification and analysis of multivariate observations," Proceedings of the Fifth Berkeley Symposium on Mathematical Statistics and Probability, 1967, 1:281-297.

Makhoul et al., "Vector quantization in speech coding," Proceedings of the IEEE, Nov. 1985, 73(11):1551-1588.

Mehri et al., "SampleRNN: An Unconditional End-to-End Neural Audio Generation Model," Feb. 11, 2017, 11 pages.

Mentzer et al., "High-fidelity generative image compression," Advances in Neural Information Processing Systems 33, 2020, 12 pages.

Morishima et al., "Speech coding based on a multi-layer neural network," IEEE International Conference on Communications, Including Supercomm Technical Sessions, Apr. 1990, 2:429-433.

Pascual et al., "Segan: Speech enhancement generative adversarial network," arXiv, Jun. 9, 2017, 5 pages.

Perez et al., "FiLM: Visual Reasoning with a General Conditioning Layer," Proceedings of the AAAI Conference on Artificial Intelligence, Apr. 29, 2018, 32(1):3942-3951.

Polyak et al., "Speech Resynthesis from Discrete Disentangled Self-Supervised Representations," arXiv, Jul. 27, 2021, 5 pages.

(56) References Cited

OTHER PUBLICATIONS

Razavi et al., "Generating Diverse High-Fidelity Images with VQ-VAE-2," arXiv, Jun. 2, 2019, 15 pages.
Rethage et al., "A Wavenet for Speech Denoising," 2018 IEEE International Conference on Acoustics, Speech and Signal Processing (ICASSP), Apr. 2018, pp. 5069-5073.
Schroeder et al., "Code-excited linear prediction (CELP): High-quality speech at very low bit rates," ICASSP '85. IEEE International Conference on Acoustics, Speech, and Signal Processing, Apr. 1985, 10:937-940.
Sristava et al., "Dropout: a simple way to prevent neural networks from overfitting," The Journal of Machine Learning Research, Jun. 2014, 15(1):1929-1958.
Stimberg et al., "WaveNetEQ—Packet Loss Concealment with WaveRNN," 2020 54th Asilomar Conference on Signals, Systems, and Computers, Nov. 2020, pp. 672-676.
Tagliasacchi et al., "SEANet: A Multi-modal Speech Enhancement Network," arXiv, Oct. 1, 2020, 5 pages.
Valin et al., "Definition of the Opus Audio Codec," IETF RFC 6716, Sep. 2012, 326 pages.
Valin et al., "LPCNET: Improving Neural Speech Synthesis through Linear Prediction," ICASSP 2019—2019 IEEE International Conference on Acoustics, Speech and Signal Processing (ICASSP), May 2019, pp. 5891-5895.
Van den Oord et al., "Neural Discrete Representation Learning," arXiv, Nov. 2, 2017, 10 pages.
Van den Oord et al., "Parallel WaveNet: Fast High-Fidelity Speech Synthesis," Proceedings of the 35th International Conference on Machine Learning, Jul. 2018, 9 pages.
Van den Oord et al., "WaveNet: A Generative Model for Raw Audio," Sep. 19, 2016, 15 pages.
Vasuki et al., "A review of vector quantization techniques," IEEE Potentials, Jul./Aug. 2006, 25(4):39-47.
W3C.org, "WebRTC 1.0: Real-Time Communication Between Browsers," Jan. 26, 2021, retrieved on Jul. 21, 2022, retrieved from URL<https://www.w3.org/TR/2021/REC-webrtc-20210126/>, 196 pages.
Williamson et al., "Time-Frequency Masking in the Complex Domain for Speech Dereverberation and Denoising," IEEE/ACM Transactions on Audio, Speech, and Language Processing, Apr. 20, 2017, 25(7):1492-1501.
Zeghidour et al., "SoundStream: An End-to-End Neural Audio Codec," arXiv, Jul. 7, 2021, 12 pages.
Zen et al., "LibriTTS: A Corpus Derived from LibriSpeech for Text-to-Speech," arXiv, Apr. 5, 2019, 7 pages.
Zhen et al., "Cascaded Cross-Module Residual Learning towards Lightweight End-to-End Speech Coding," arXiv, Sep. 13, 2019, 5 pages.
Zhen et al., "Psychoacoustic Calibration of Loss Functions for Efficient End-to-End Neural Audio Coding," IEEE Signal Processing Letters, Nov. 20, 2020, 27:2159-2163.
International Search Report and Written Opinion in International Appln. No. PCT/US2022/036097, dated Dec. 12, 2022, 18 pages.

\* cited by examiner

COMPRESSING AUDIO WAVEFORMS USING NEURAL NETWORKS AND VECTOR QUANTIZERS

CROSS-REFERENCE TO RELATED APPLICATION

This application claims priority to U.S. Provisional Application No. 63/218,139, filed on Jul. 2, 2021. The disclosure of the prior application is considered part of and is incorporated by reference in the disclosure of this application.

BACKGROUND

This specification relates to processing data using machine learning models.

Machine learning models receive an input and generate an output, e.g., a predicted output, based on the received input. Some machine learning models are parametric models and generate the output based on the received input and on values of the parameters of the model.

Some machine learning models are deep models that employ multiple layers of models to generate an output for a received input. For example, a deep neural network is a deep machine learning model that includes an output layer and one or more hidden layers that each apply a non-linear transformation to a received input to generate an output.

SUMMARY

This specification generally describes a compression system implemented as computer programs on one or more computers in one or more locations that can compress audio waveforms. The specification further describes a decompression system implemented as computer programs on one or more computers in one or more locations that can decompress audio waveforms.

Generally, the compression system and the decompression system can be located in any appropriate locations. In particular, the compression system can optionally be located remotely from the decompression system. For example, the compression system can be implemented by one or more first computers at a first location, while the decompression system can be implemented by one or more second (different) computers at a second (different) location.

In some implementations, the compression system can generate a compressed representation of an input audio waveform and store the compressed representation in a data store, e.g., a logical data storage area or a physical data storage device. The decompression system can later access the compressed representation from the data store, and process the compressed representation to generate a corresponding output audio waveform. The output audio waveform can be, e.g., a reconstruction of the input audio waveform or an enhanced (e.g., de-noised) version of the input audio waveform.

In some implementations, the compression system can generate a compressed representation of an input audio waveform and transmit the compressed representation to a destination over a data communication network, e.g., a local area network, a wide area network, or the internet. The decompression system can access the compressed representation at the destination, and process the compressed representation to generate a corresponding output waveform.

The subject matter described in this specification can be implemented in particular embodiments so as to realize one or more of the following advantages.

The compression/decompression systems described in this specification can enable audio data to be compressed more efficiently than some conventional systems. By enabling more efficient audio data compression, the systems allow more efficient audio data transmission (e.g., by reducing the communication network bandwidth required to transmit audio data) and more efficient audio data storage (e.g., by reducing the amount of memory required to store audio data).

The compression/decompression systems include an encoder neural network, a set of vector quantizers, and a decoder neural network that are jointly trained (i.e., from "end-to-end"). Jointly training the respective neural network parameters of the encoder and decoder neural networks along with the codebooks of the vector quantizers enables the parameters of the compression/decompression systems to be adapted in unison to achieve more efficient audio compression than would otherwise be possible. For example, as the neural network parameters of the encoder neural network are iteratively adjusted, the codebooks of the vector quantizers are simultaneously optimized to enable more accurate quantization of the feature vectors generated by the encoder neural network. The neural network parameters of the decoder neural network are also simultaneously optimized to enable more accurate reconstruction of audio waveforms from quantized feature vectors generated using the updated codebooks of the vector quantizers.

Performing vector quantization of feature vectors representing audio waveforms using a single vector quantizer, where each feature vector is represented using r bits, can require a codebook of size $2^r$. That is, the size of the codebook of the vector quantizer can increase exponentially with the number of bits allocated to represent each feature vector. As the number of bits allocated to represent each feature vector increases, learning and storing the codebook becomes computationally infeasible. To address this issue, the compression/decompression systems perform vector quantization using a sequence of multiple vector quantizers that each maintain a respective codebook. The first vector quantizer can directly quantize feature vectors generated by the encoder neural network, while each subsequent vector quantizer can quantize residual vectors that define the quantization error generated by the preceding vector quantizer.

The sequence of vector quantizers can iteratively refine the quantization of feature vectors while each maintaining a dramatically smaller codebook that would be required by a single vector quantizer. For example, each vector quantizer can maintain a codebook of size $$2^{\frac{r}{N_q}}$$

where r is the number of bits allocated to represent each feature vector and $N_q$ is the number of vector quantizers. Performing vector quantization using a sequence of multiple vector quantizers thus enables the compression/decompression system to reduce the memory required to store the quantizer codebooks and allows vector quantization to be performed in situations in which doing so would otherwise be computationally infeasible.

Performing vector quantization using a set of multiple vector quantizers (i.e., rather than a single vector quantizer) also enables the compression/decompression systems to control the compression bitrate, e.g., the number of bits used to represent each second of audio data. To reduce the bitrate, the compression/decompression systems can perform vector quantization using fewer vector quantizers. Conversely, to increase the bitrate, the compression/decompression systems can perform vector quantization using more vector quantizers. During training, the number of vector quantizers used for compression/decompression of each audio waveform can be varied (e.g., randomly) across training examples, causing the compression/decompression systems to learn a single set of parameter values that enable effective compression/decompression across a range of possible bitrates. Thus the compression/decompression systems enable reduced consumption of computational resources by obviating any requirement to train and maintain multiple respective encoders, decoders, and vector quantizers that are each optimized for a respective bitrate.

The compression/decompression systems can be trained to jointly perform both audio data compression and audio data enhancement, e.g., de-noising. That is, the compression and decompression systems can be trained to simultaneously enhance (e.g., de-noise) an audio waveform as part of compressing and decompressing the waveform without increasing overall latency. In contrast, some conventional systems apply a separate audio enhancement algorithm to an audio waveform at the transmitter side (i.e., before compression) or at the receiver side (i.e., after decompression) which can result in increased latency.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
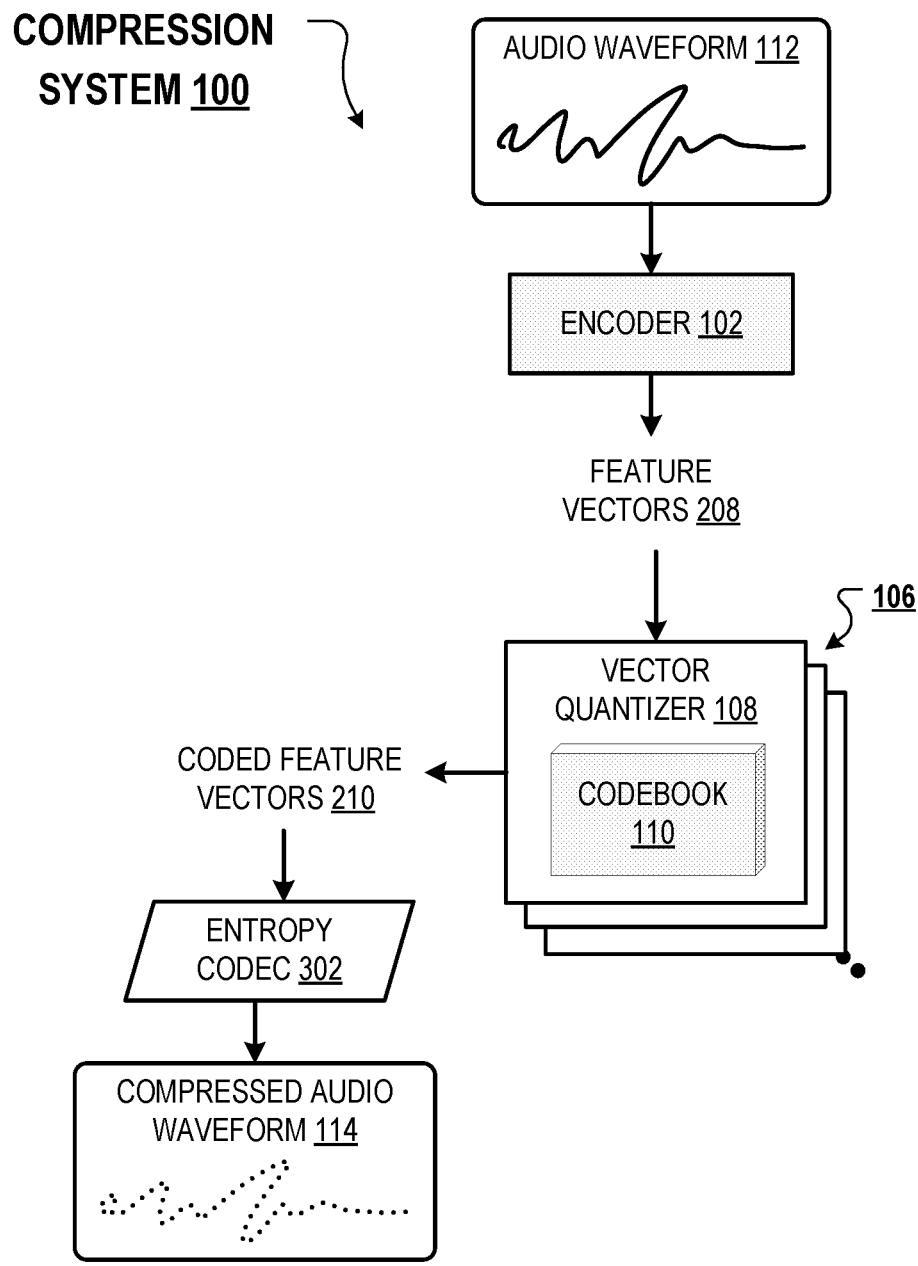
FIG. 1 depicts an example audio compression system that can compress audio waveforms using an encoder neural network and a residual vector quantizer.
Figure 2:
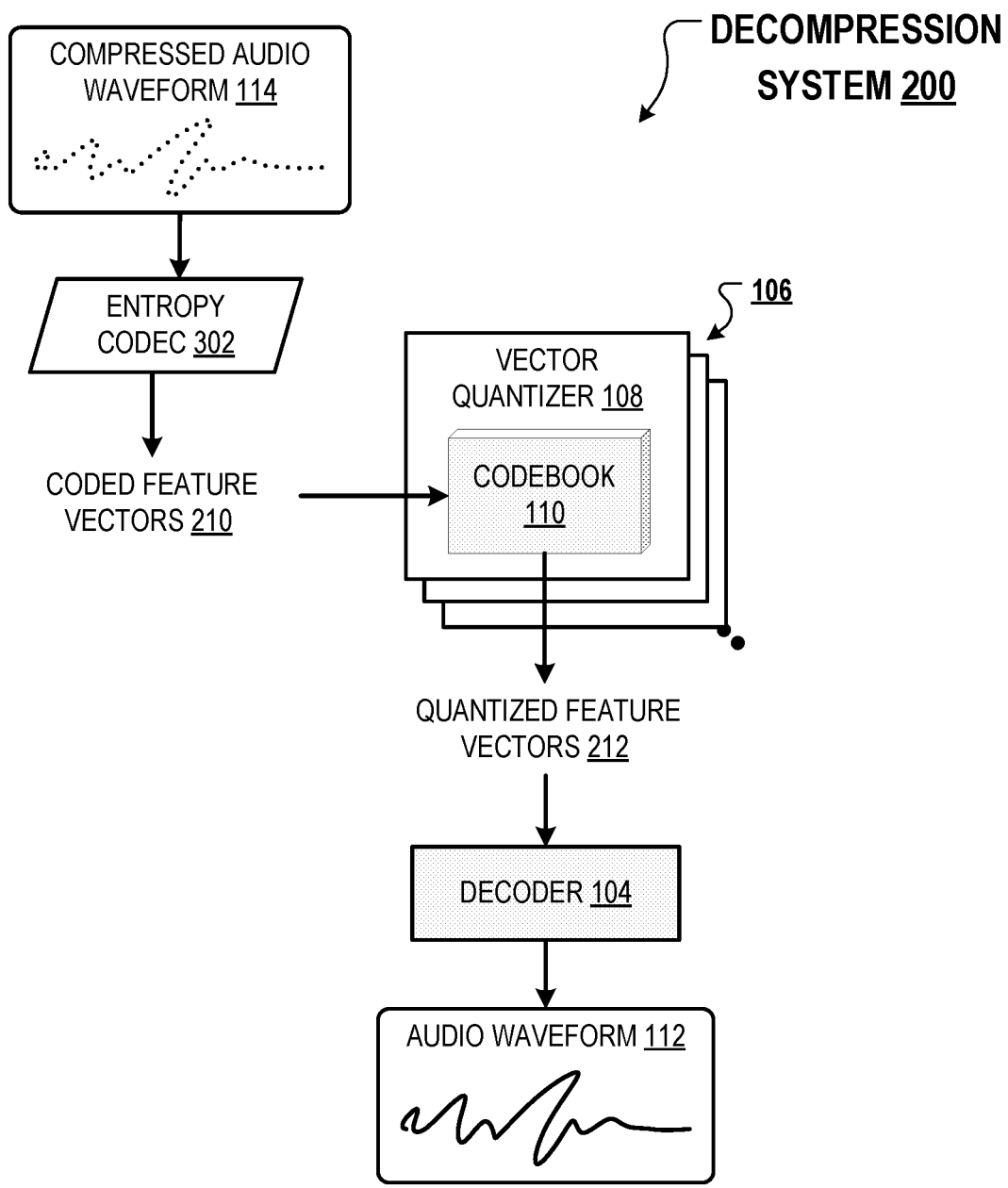
FIG. 2 depicts an example audio decompression system that can decompress compressed audio waveforms using a decoder neural network and a residual vector quantizer.

FIG. 1 depicts an example audio compression system 100 that can compress audio waveforms using an encoder neural network 102 and a residual vector quantizer 106. Similarly, FIG. 2 depicts an example audio decompression system 200 that can decompress compressed audio waveforms using a decoder neural network 104 and the residual vector quantizer 106. For clarity, reference will be made to both FIG. 1 and FIG. 2 when describing various components involved in compression and decompression. The audio compression/decompression systems 100/200 are examples of systems implemented as computer programs on one or more computers in one or more locations in which the systems, components, and techniques described below are implemented.

The compression/decompression systems 100/200 utilize a neural network architecture (neural codec) that can outperform traditional codecs, e.g., waveform and parametric codecs, in terms of operational bitrates and general-purpose audio compression. For comparison, waveform codecs typically use time/frequency domain transforms for compression/decompression while making little or no assumptions about the source audio. As a consequence of this, they produce high-quality audio at mid-to-high level bitrates but tend to introduce coding artifacts at low bitrates. Parametric codecs can overcome this problem by making specific assumptions about the source audio (e.g., speech) but are ineffective for general-purpose audio compression. Conversely, the audio compression and decompression systems 100/200 can compress and decompress speech, music and general audio at bitrates normally targeted by speech-tailored codecs (e.g., parametric codecs). Hence, the audio compression/decompression systems 100/200 can operate in modalities that conventional codecs are incapable of. In some implementations, the compression and decompression systems 100/200 can be configured for specific types of audio content (e.g., speech) due to the flexibility admitted by the neural network architecture.

Referring to FIG. 1, the compression system 100 receives an audio waveform 112 to be compressed. The waveform 112 can include an audio sample at each time step, where the time step usually corresponds to a particular sampling rate. Higher sampling rates capture higher frequency components of the audio waveform 112. For example, the standard audio sampling rate used by professional digital equipment is 48 kHz since it can reconstruct sound at frequencies up to 24 kHz (e.g., upper limit of human hearing). Although such sampling rates are ideal for comfortable listening, the compression system 100 can generally be configured to process waveforms 112 at any sampling rate, even waveforms with non-uniform sampling.

The audio waveform 112 can originate from any suitable audio source. For example, the waveform 112 can be a recording from an external audio device (e.g., speech from a microphone), a purely digital production (e.g., electronic music), or generic audio such as sound effects and background noise (e.g., white noise, room tone). In some implementations, the audio compression system 100 can perform audio enhancement, e.g., suppressing unwanted background noise, simultaneously when compressing the waveform 112.

In conventional audio processing pipelines, compression and enhancement are usually performed by separate modules. For example, it is possible to apply an audio enhancement algorithm at the input of the encoder 102, before a waveform is compressed, or at the output of the decoder 104, after the waveform is decompressed. In this setup, each processing step contributes to the end-to-end latency, e.g., due to buffering the waveform to an expected frame length of the algorithm. Conversely, utilizing judicious training of various neural network components (see FIG. 3), the audio compression system 100 can accomplish joint compression and enhancement without relying on a separate module and incurring no additional latency. In some implementations, the audio decompression system 200 implements joint decompression and enhancement. In general, the compression system 100, decompression system 200, or both can be designed to perform audio enhancement by adequately training the neural network components.

The audio waveform 112 is processed (e.g., encoded) by the encoder 102 to generate a sequence of feature vectors 208 representing the waveform 112. Feature vectors 208 (e.g., embeddings, latent representations) are compressed representations of waveforms that extract the most relevant information about their audio content. The encoder 102 can down-sample the input waveform 202 to generate the compressed feature vectors 208, such that the feature vectors 208 have a lower sampling rate than the original audio waveform 112. For example, the encoder neural network 102 can use multiple convolutional layers with increasing strides to generate feature vectors 208 at the lower sampling rate (e.g., lower temporal resolution).

The feature vectors 208 are then processed by a residual (e.g., multi-stage) vector quantizer RVQ 106 to generate coded representations of the feature vectors (CFVs) 210 and corresponding quantized representations of the feature vectors (QFVs) 212. The RVQ 106 can generate QFVs 212 at a particular bitrate by leveraging one or more vector quantizers 108. The RVQ 108 realizes (lossy) compression by mapping the higher-dimensional space of feature vectors 208 to a discrete subspace of code vectors. As will be elaborated below, a CFV 210 specifies codewords (e.g., indices) from respective codebooks 110 of each vector quantizer 108, where each codeword identifies a code vector stored in the associated codebook 110. Consequently, a QFV 212 is an approximation of a feature vector 208 defined by the combination of code vectors specified by the corresponding CFV 212. Generally, the QFV 212 is a summation (e.g., linear combination) of code vectors specified by the CFV 212.

In some cases, the RVQ 106 uses a single vector quantizer 108 with a single codebook 110. The quantizer 108 can compress a feature vector 208 into a QFV 212 by choosing a code vector in its codebook 110 to represent the feature vector 208. The quantizer 106 can select the code vector based on any appropriate distance metric (e.g., error) between the two vectors, e.g., $L^n$-norm, cosine distance, etc. For example, the RVQ 106 can select the code vector with the smallest Euclidean norm (e.g., $L^2$-norm) relative to the feature vector 208. The quantizer 106 can then store the corresponding codeword in a CFV 210. Since codewords generally require fewer bits than code vectors, CFVs 210 consume less space in memory and can achieve greater compression than QFVs 212 with no additional loss.

Nevertheless, a single vector quantizer 108 approach can become prohibitively expensive, as the size of the codebook 110 grows exponentially as the bitrate is increased. To overcome this problem, the RVQ 106 can utilize a sequence of vector quantizers 108. In this case, each vector quantizer 108 in the sequence contains a respective codebook 110 of code vectors. The RVQ 106 can then use an iterative method to generate the CFVs 210 and corresponding QFVs 212, such that each vector quantizer 108 in the sequence further refines quantization.

For example, at the first vector quantizer 108, the quantizer 106 can receive the feature vector 208 and select a code vector from its codebook 110 to represent the feature vector 208 based on a smallest distance metric. A residual vector can be computed as the difference between the feature vector 208 and the code vector representing the feature vector 208. The residual vector can be received by the next quantizer 108 in the sequence to select a code vector from its codebook 110 to represent the residual vector based on a smallest distance metric. The difference between these two vectors can be used as the residual vector for the next iteration. This iterative method can continue for each vector quantizer 108 in the sequence. Every code vector identified in the method can be summed into the QFV 212 and the codeword of each code vector can be stored in a respective CFV 210.

In general, the RVQ 106 can utilize any suitable number of vector quantizers 108. The number of quantizers $N_q$ and the size of each codebook $N_i$ control tradeoffs between computational complexity and coding efficiency. Hence, a sequence of quantizers 108 provides a flexible means of balancing these two opposing factors. In some cases, the size of each codebook $N_i = N$ is identical such that the total bit budget is allocated uniformly across each vector quantizer 108. A uniform allocation provides a practical modularity to the RVQ 106 as each codebook 110 consumes the same space in memory.

Moreover, for fixed size codebooks $N_i$, the number of vector quantizers $N_q$ in the sequence determines the resulting bitrate of the QFVs 212, where higher bitrates correspond to a larger number of quantizers 108. Thus, the RVQ 106 offers a convenient framework for variable (e.g., scalable) bitrates by employing a structured dropout of quantizers 108. That is, the audio compression and decompression systems 100/200 can vary the number of quantizers 108 in the sequence to target any desired bitrate, facilitating adjustable performance and reducing overall memory footprint compared with multiple fixed bitrate codecs. Due to these capabilities, the compression/decompression systems 100/200 can be particularly amendable to low latency implementations, apt for devices with limited computing resources (e.g., smartphones, tablets, watches, etc.).

The CFVs 218 can then be further compressed, for example using an entropy codec 302, into a compressed representation of the audio waveform 114. The entropy codec 302 can implement any appropriate lossless entropy coding, e.g., arithmetic coding, Huffman coding, etc.

Referring to FIG. 2, the decompression system 200 receives a compressed representation of an audio waveform 114. In general, the compressed audio waveform 114 can represent any type of audio content, e.g., speech, music, general audio, etc. Granted, as mentioned previously, the audio compression and decompression systems 100/200 can be implemented for specific tasks (e.g., speech-tailored compression/decompression) to optimize around specific types of audio content.

The compressed audio waveform 114 can be decompressed into CFVs 210, for example using the entropy codec 302. The CFVs 210 are then processed by the RVQ 106 into QFVs 212. As described above, each CFV 210 includes codewords (e.g., indices) that identify code vectors in respective codebooks 110 of each vector quantizer 108. The combination of code vectors specified by each CFV 210 identifies the corresponding QFV 212. Generally, the code vectors identified by each CFV 210 are summed into the corresponding QFV 212.

The QFVs 212 can then be processed (e.g., decoded) by the decoder 104 to generate an audio waveform 112. The decoder 104 generally mirrors the processes of the encoder 102 by outputting waveforms starting from (quantized) feature vectors. The decoder 104 can up-sample the QFVs 212 to generate the output waveform 206 at a higher sampling rate than the input QFVs 212. For example, the decoder 102 can use multiple convolutional layers with decreasing strides to generate the output waveform 206 at the higher sampling rate (e.g., higher temporal resolution).

Note that the compression/decompression systems 100/200 can be realized in various different implementations such as being integrated as a single system or as separate systems. Moreover, components of each of the compression/decompression systems 100/200 need not be constrained to a single client device. For example, in some implementations, the compression system 100 stores the compressed audio waveform 114 in local storage which is then retrieved from local storage by the decompression system 200. In other implementations, the compression system 100 on a transmitter client transmits the compressed audio waveform 114 across a network (e.g., internet, 5G cellular network, Bluetooth, Wi-Fi, etc.) which can be received by the decompression system 200 on a receiver client.

As will be described in more detail below, the neural network architecture can be trained using a training system 300. The training system 300 can enable efficient general-purpose compression or tailored compression (e.g., speech-tailored) by utilizing a suitable set of training examples 116 and various training procedures. Specifically, the training system 300 can jointly train the encoder neural network 102 and decoder neural network 104 to efficiently encode and decode feature vectors 208 of various waveforms contained in the training examples 116. Furthermore, the training system 300 can train the RVQ 106 to efficiently quantize the feature vectors 208. In particular, each codebook 110 of each cascading vector quantizer 108 can be trained to minimize quantization error. To facilitate trainable codebooks 110, each vector quantizer 108 can, for example, be realized as a vector quantized variational autoencoder (VQ-VAE).

The audio compression/decompression systems 100/200 can be a fully "end-to-end" machine learning approach when implementing this data-driven training solution. In the end-to-end implementation, the compression/decompression systems 100/200 leverage the neural networks for all tasks involved in training, as well as inference after training. No processing, such as feature extraction, is performed by an external system. In general, the training system 300 can utilize unsupervised learning algorithms, semi-supervised learning algorithms, supervised learning algorithms, or more elaborate combinations of these. For example, the training system 300 can balance reconstruction losses with adversarial losses to enable audio compression that is both faithful and perceptually similar to the original audio on playback.

Generally, the neural networks included in the audio compression/decompression systems 100/200 can have any appropriate neural network architectures which enable them to perform their described functions. In particular, the neural networks can each include any appropriate neural network layers (e.g., fully-connected layer, convolutional layers, attention layers, etc.) in any appropriate numbers (e.g., 5, 10, or 100 layers) and arranged in any appropriate configuration (e.g., as a linear sequence of layers).

Figure 8A:
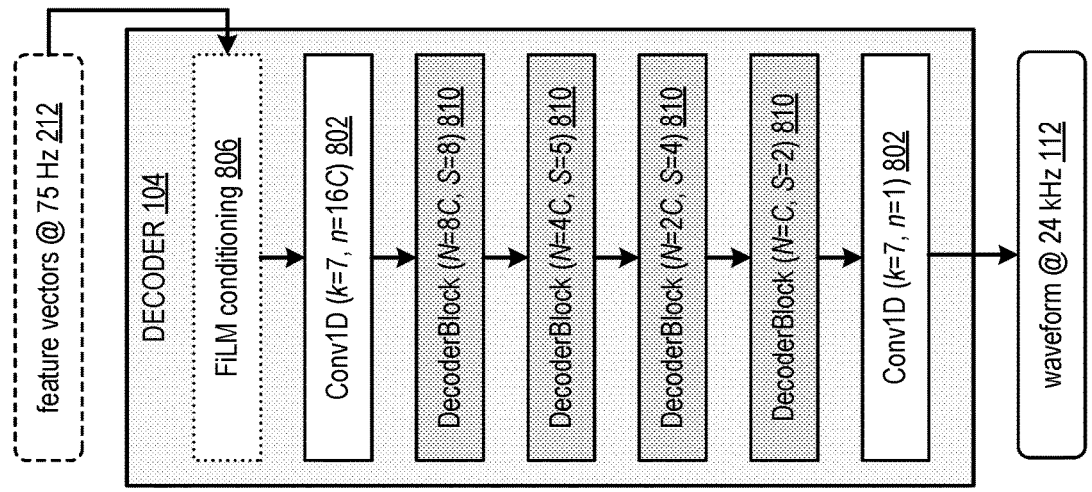
FIGS. 8A and 8B show an example of a fully convolutional neural network architecture.
Figure 8A:
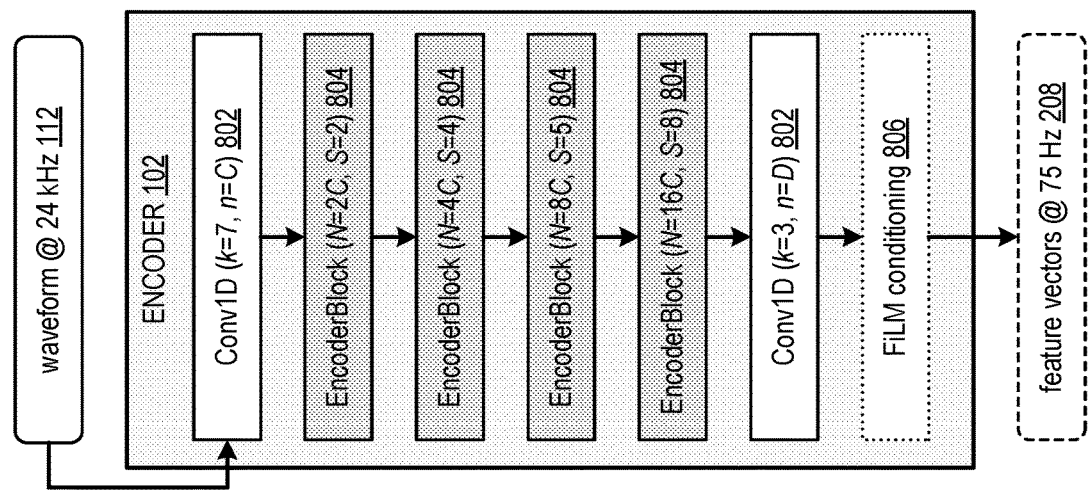
Figure 8B:
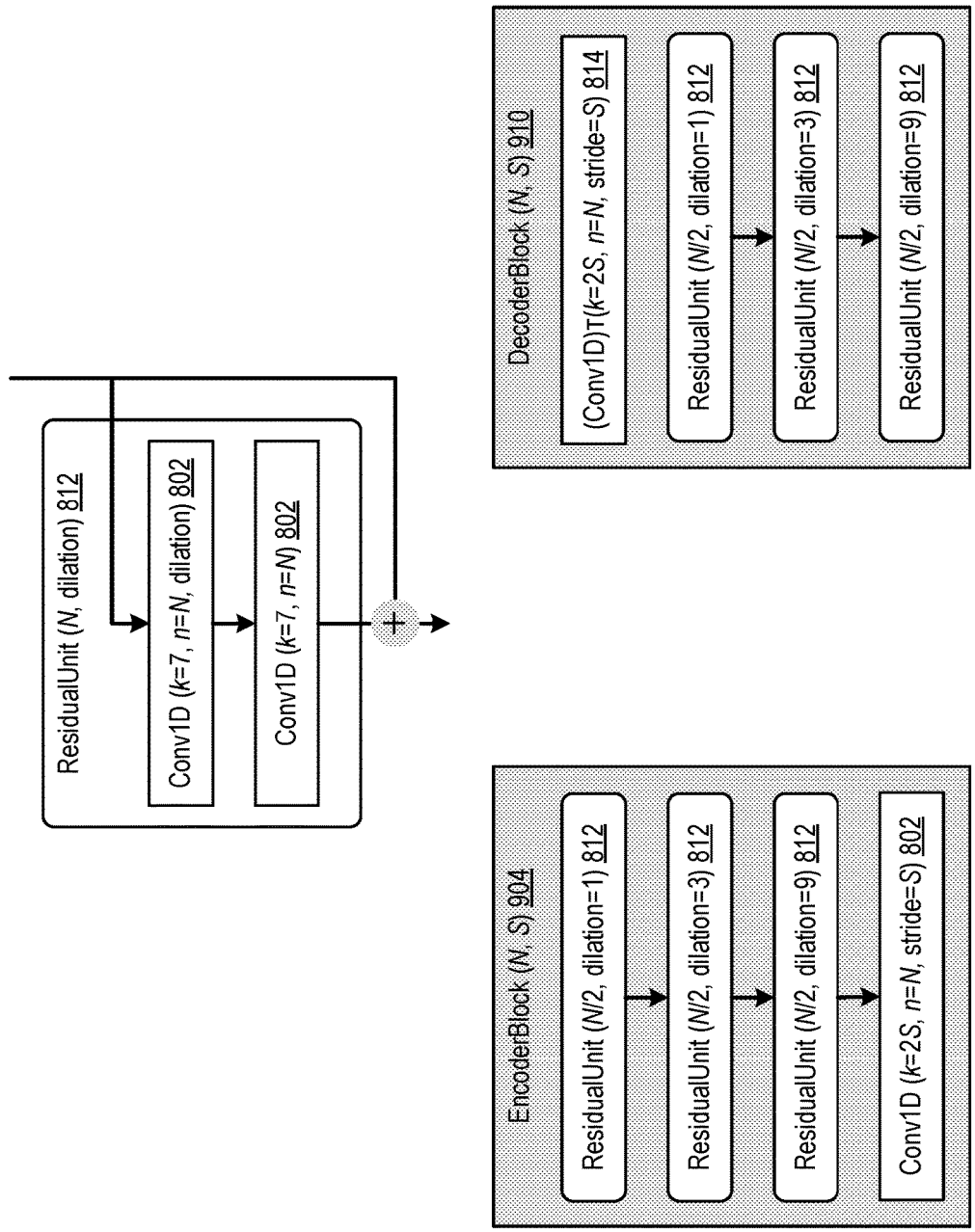

In some implementations, the compression/decompression systems 100/200 exploit a fully convolutional neural network architecture. FIGS. 8A and 8B show an example implementation of such an architecture for the encoder 102 and decoder 104 neural networks. A fully convolutional architecture can be particularly advantageous for low latency compression since it has a lower scale connectivity compared to fully-connected networks (e.g., multilayer perceptrons) and has filters (e.g., kernels) that can be optimized to limit coding artifacts. Moreover, convolutional neural networks provide an effective means of resampling the waveform 112, i.e., changing the temporal resolution of the waveform 112, by using different strides for different convolutional layers.

In further implementations, the compression/decompression systems 100/200 use strictly causal convolutions when implementing a fully convolutional architecture, such that padding is only applied to the past but not the future in both training and offline inference. No padding is necessary for streaming inference. In this case, the overall latency of the compression and decompressions systems 100/200 is determined entirely by the temporal resampling ratio between waveforms and their corresponding feature vectors.

Figure 3:
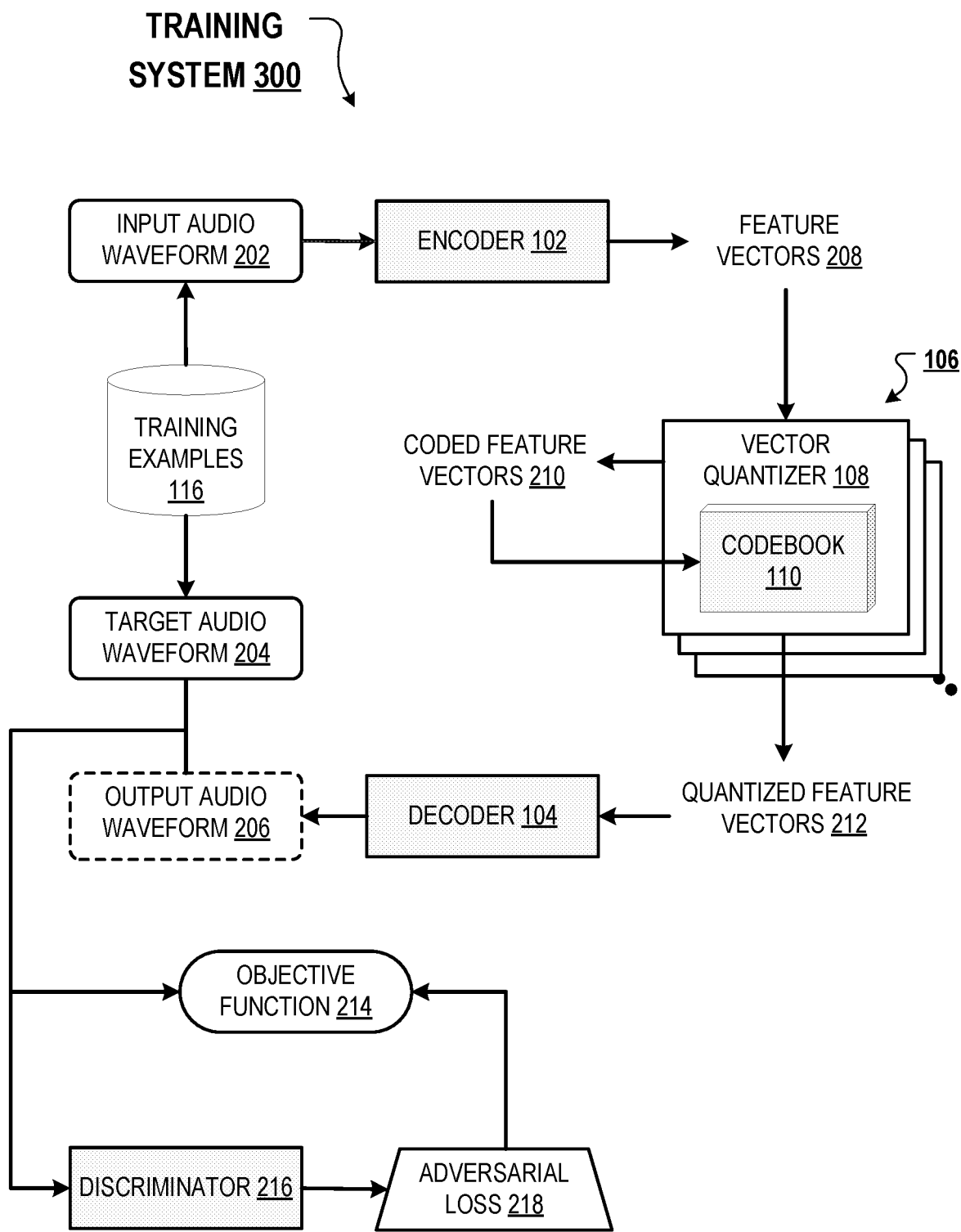
FIG. 3 is a schematic diagram of an example training system that can jointly train an encoder neural network, a decoder neural network and a residual vector quantizer.

FIG. 3 shows operations performed by an example training system 300 to jointly train an encoder neural network 102, a decoder neural network 104 and a residual vector quantizer 106. The neural networks are trained end-to-end on an objective function 214 that can include numerous reconstruction losses. In some implementations, a discriminator neural network 216 is also trained to facilitate adversarial losses 218 and, in some cases, additional reconstruction losses.

The training system 300 receives a set of training examples 116. Each training example 116 includes a respective input audio waveform 202 and a corresponding target audio waveform 204 that the neural networks are trained to reconstruct. That is, using the objective function 214, the target waveform 204 can be compared with a resulting output audio waveform 206 to evaluate performance of the neural networks. Specifically, the objective function 214 can include a reconstruction loss that measures an error between the target waveform 204 and the output waveform 206. In some cases, a point-wise reconstruction loss on the raw waveforms is implemented, for example, using a mean squared error between the waveforms.

However, this type of reconstruction loss may have limitations in certain cases, e.g., because two distinct waveforms can sound perceptually identical, while point-wise similar waveforms can sound very different. To alleviate this problem, the objective function 214 can utilize a multi-scale spectral reconstruction loss that measures an error between mel-spectrograms of the target waveform 204 and the output waveform 206. A spectrogram characterizes the frequency spectrum of an audio waveform over time, e.g., using a short-time Fourier transform (STFT). A mel-spectrogram is a spectrogram converted to mel-scale. Since humans generally do not perceive sound frequencies on a linear scale, the mel-scale can appropriately weigh frequency components to promote fidelity. For example, the reconstruction loss $\mathcal{L}_{rec}$ between the target waveform x̃ and the output waveform x̂ can include terms that measure an absolute error and a log error of mel-spectrograms, $$\mathcal{L}_{rec} = \sum_{s \in 2^6, \ldots, 2^{11}} \sum_t (\|S_t^s(\tilde{x}) - S_t^s(\hat{x})\|_1 + \alpha_s \|\log S_t^s(\tilde{x}) - \log S_t^s(\hat{x})\|_2)$$

where $\| \ldots \|_n$ indicates the $L^n$-norm. Although other reconstructions losses are possible, this form of $\mathcal{L}_{rec}$ satisfies a strictly proper scoring rule which can be desirable for training purposes. Here, $S_t^s$ denotes the t-th frame (e.g., timeslice) of a 64-bin mel-spectrogram computed with window length equal to s and hop length equal to s/4. The $\alpha_s$ coefficient can be set to $$\alpha_s = \sqrt{s/2}.$$

As mentioned previously, the set of training examples 116 can be selected to enable various modalities of the compression/decompression systems 100/200, such as general-purpose audio compression, speech-tailored compression, etc. For example, to train for general-purpose audio compression, the training examples 116 can include speech, music, and general audio waveforms. In other implementations, the training examples 116 may only include music waveforms to facilitate optimal music compression and playback.

In some cases, the target waveform 204 is identical to the input waveform 202, which can train the neural networks towards faithful and perceptually similar reconstructions. However, the target waveform 204 can also be modified with respect to the input waveform 202 to encourage more sophisticated functionalities, such as joint compression and enhancement. The nature of the enhancement can be determined by designing training examples 116 with certain qualities. For instance, the target waveform 204 can be a speech enhanced version of the input waveform 202, such that the neural networks improve audio dialogue upon reconstruction of waveforms. Alternatively or in addition, the target waveform 204 can be a denoised version of the input waveform 202, which trains the networks to suppress background noise. In general, any desired audio enhancement can be enabled using this technique.

In further implementations, the encoder 102 and/or decoder 104 can be conditioned on data, usually included in the training examples 116, that defines whether the target waveform 204 is identical to the input waveform 202 or is an enhanced version of the waveform 202. For instance, the training examples 116 can include a conditioning signal that represents the two modes (enhancement enabled or disabled), such that the neural networks are trained to only enable enhancement when the signal is present. To implement this, the encoder 102 and/or decoder 104 can have a dedicated layer, such as a Feature-wise Linear Modulation (FiLM) layer, to process the conditioning signal. After training, this technique can allow the audio compression/decompression systems 100/200 to flexibly control enhancement in real-time by feeding the conditioning signal through the network. Accordingly, the compression system 100 can implement this controllable enhancement to permit compression of acoustic scenes and natural sounds that would be otherwise removed by enhancement (e.g., denoising).

Returning now to the encoder neural network 102. The input waveform 202 is processed by the encoder 102 and encoded into a sequence of feature vectors 208. This process, that may involve numerous encoder network layers, can be collectively represented by an encoder function $\varepsilon_\theta$ that maps the input waveform x to the feature vectors y, such that $y(x)=\varepsilon_\theta(x)$. The encoder function $\varepsilon_\theta$ is parametrized by encoder network parameters $\theta$ which can be updated using the objective function 214 to minimize losses during encoding.

The feature vectors 208 are then compressed by the RVQ 106 to generate coded CFVs 210 and corresponding QFVs 212. Note that the quantization process of the RVQ 106, which may involve numerous vector quantizers 108, can be collectively represented by a RVQ function $Q_\psi$ that maps the feature vectors y to the QFVs ŷ, such that $ŷ(x)=Q_\psi(y)=Q_\psi(\varepsilon_\theta(x))$. The RVQ function $Q_\psi$ is parametrized by codebook parameters $\psi$ which can be updated using the objective function 214 to minimize losses during quantization.

The training system 300 can minimize the quantization loss associated with the RVQ 106 by properly aligning the code vectors with the vector space of feature vectors 208. That is, the codebook parameters $\psi$ can be updated by the training system 300 by backpropagating gradients of the objective function 214. For example, the codebooks 110 can be repeatedly updated during training using exponential moving averages of the feature vectors 208. The training system 300 can also improve usage of the codebooks 110 by running a k-means algorithm on a first set of training examples 116 and using the learned centroids as initialization for the following training examples 116. Alternatively or in addition, if a code vector has not been assigned to a feature vector 208 for numerous training examples 116, the training system 300 can replace it with a random feature vector 208 sampled during a current training example 116. For example, the training system 300 can track the exponential moving average of assignments to each code vector (with a decay factor of 0.99) and replace the code vectors of which this statistic falls below 2.

To adequately train the neural networks for variable (e.g., scalable) bit rates, the training system 300 can select a particular number $n_q$ of vector quantizers 108 to be used for each training example 116, such that the number of quantizers 108 differs between training examples 116. For instance, the training system 300 can sample $n_q$ uniformly at random in $[1; N_q]$, for each training example 116, and only use the first i=1 ... $n_q$ quantizers 108 in the sequence. Consequently, the networks are trained to encode and decode audio waveforms for all target bitrates corresponding to the range $n_q=1 \ldots N_q$ and no architectural changes are necessary for the encoder 102 or decoder 104. After training, the audio compression and decompression systems 100/200 can select a particular number of quantizers $n_q$ during compression and decompression which accommodates a desired bitrate.

Referring now to the decoder neural network 104. The QFVs 212 are processed by the decoder 104 and decoded into the output audio waveform 206. Analogous to the encoder 102, decoding may involve numerous decoder network layers, that can be collectively represented by a decoder function $\mathcal{D}_\phi$. The decoder function $\mathcal{D}_\phi$ maps the input QFVs ŷ to the output waveform x̂, such that $x̂(x)=\mathcal{D}_\phi(ŷ)=\mathcal{D}_\phi(Q_\psi(\varepsilon_\theta(x)))$. In some implementations, the input waveform x and the output waveform x̂ have the same sampling rate, but this need not be the case. The decoder function $\mathcal{D}_\phi$ is parametrized by decoder network parameters $\phi$ which can be updated using the objective function 214 to minimize losses during decoding.

Since the output waveform x̂ generally depends on encoder network parameters $\theta$, codebook parameters and decoder network parameters $\phi$, the objective function 214, which includes reconstruction losses between the output waveform 206 and the target waveform 204 of each training example 116, can be used to update these network parameters. Specifically, gradients of the objective function 214 can be computed to iteratively update the network parameters with backpropagation, e.g., using a gradient descent method. Generally, the network parameters are updated with the goal of optimizing the objective function 214.

In some implementations, the training system 300 exploits a discriminator neural network 216 to incorporate adversarial loss 218 into the objective function 214, and potentially additional reconstruction losses. The adversarial loss 218 can promote perceptual quality of waveforms reconstructed by the neural networks. In this case, the discriminator 216 is jointly trained by the training system 300 and contests with the encoder 102, decoder 104, and RVQ 106. That is, the discriminator 216 is trained to distinguish target waveforms 204 from output waveforms 206 while the encoder 102, decoder 104 and RVQ 106 are trained to fool the discriminator 216.

The discriminator 216 can implement this into the adversarial loss 218 by using a set of discriminator scores $\mathcal{L}_k$ with $k=\{1, 2, \ldots, K\}$, such that each score characterizes an estimated likelihood that the output waveform 206 is not generated as output from the decoder 104. For example, the discriminator 216 can receive the output waveform $\hat{x}$ from the decoder 104 and process the waveform using one or more neural network layers to generate logits $\mathcal{G}_{k,t}(\hat{x})$. In this case $\mathcal{G}_{k,t}$ is a discriminator function that maps an input waveform to output logits. k indexes a particular discriminator output and t indexes a particular logit of the discriminator output. In some implementations, the discriminator 216 utilizes a fully convolutional neural network such that the number of logits is proportional to the length of the input waveform.

The discriminator 216 can use the logits to determine the respective discriminator scores $\mathcal{L}_k$ for each discriminator output k. For example, each score $\mathcal{L}_k$ can be determined from the average over logits as, $$\mathcal{L}_k = E_x \left[ \frac{1}{T_k} \sum_t \max[0, 1 - \mathcal{G}_{k,t}(\hat{x}(x))] \right]$$

Here, $T_k$ is the total number of logits for the output k and $E_x$ is the expected value over x. In some implementations, the adversarial loss $\mathcal{L}_{adv}$ is an average over the discriminator scores $\mathcal{L}_k$, $$\mathcal{L}_{adv} = \frac{1}{K} \sum_k \mathcal{L}_k$$

The adversarial loss $\mathcal{L}_{adv}$ can be included in the objective function 214 to promote perceptual quality of reconstructed waveforms. Moreover, the discriminator 216 can be trained by the training system 300 to distinguish target waveforms $\tilde{x}$ from output waveforms $\hat{x}$ by minimizing a discriminator loss function $\mathcal{L}_{dis}$. In some implementations, $\mathcal{L}_{dis}$ has the form, $$\mathcal{L}_{dis} = \frac{1}{K} \sum_k E_x \left[ \frac{1}{T_k} \sum_t \max[0, 1 - \mathcal{G}_{k,t}(\tilde{x}(x))] \right] + \frac{1}{K} \sum_k E_x \left[ \frac{1}{T_k} \sum_t \max[0, 1 + \mathcal{G}_{k,t}(\hat{x}(x))] \right]$$

Note, target waveforms $\tilde{x}(x)$ generally depend on input waveforms x in that they can be identical to the input waveform $\tilde{x}(x)=x$ or an enhanced version. By training the discriminator 216 to efficiently classify target waveforms 204 from output waveforms 206 with respect to $\mathcal{L}_{dis}$, the encoder 102, decoder 104, and RVQ 106 learn to fool the discriminator by minimizing $\mathcal{L}_{adv}$.

In some implementations, the discriminator 216 exploits different versions of the waveforms to determine the discriminator scores $\mathcal{L}_k$. For example, besides the original waveforms, the discriminator 216 can also use down-sampled versions of the waveforms (e.g., 2-times down-sampled, 4-times down-sampled, etc.) or Fourier-transformed versions of the waveforms (e.g., STFT, Hartley transform, etc.) which adds diversity to the adversarial loss 218. As a particular implementation using four discriminator scores, the $\mathcal{L}_{k=1}$ score can correspond to a STFT waveform, while discriminator scores $\mathcal{L}_{k=2,3,4}$ can correspond to an original waveform, a 2-times down-sampled waveform and a 4-times down-sampled waveform.

In further implementations, the discriminator 216 introduces a reconstruction loss in the form of a "feature loss". Specifically, the feature loss $\mathcal{L}_{feat}$ measures an error between the discriminator's internal layer outputs for the target audio waveform 204 and those for the output audio waveform 206. For example, the feature loss $\mathcal{L}_{feat}$ can be expressed as the absolute difference between discriminator outputs $\mathcal{G}_{k,t}^{(l)}$ for the target waveform $\tilde{x}$ and output waveform $\hat{x}$ for each layer $l \in \{1, 2, \ldots, L\}$ as, $$\mathcal{L}_{feat} = E_x \left[ \frac{1}{KL} \sum_{k,l} \frac{1}{T_{k,l}} \sum_t |\mathcal{G}_{k,t}^{(l)}(\tilde{x}(x)) - \mathcal{G}_{k,t}^{(l)}(\hat{x}(x))| \right]$$

The feature loss can be a useful tool to promote increased fidelity between the output waveform 206 and the target waveform 204. Taking into account all the aforementioned loss terms, the objective function $\mathcal{L}$ can control tradeoffs between reconstruction losses, adversarial losses, as well as feature losses, $$\mathcal{L} = \lambda_{rec} \mathcal{L}_{rec} + \lambda_{adv} \mathcal{L}_{adv} + \lambda_{feat} \mathcal{L}_{feat}$$

By weighting appropriate loss terms with weight factors $\lambda_{rec}$, $\lambda_{adv}$ and $\lambda_{feat}$, the objective function 214 can emphasize certain properties, such as faithful reconstructions, fidelity, perceptual quality, etc. In some implementations, the weight factors are set to $\lambda_{rec}=\lambda_{adv}=1$ and $\lambda_{feat}=100$.

Figure 4:
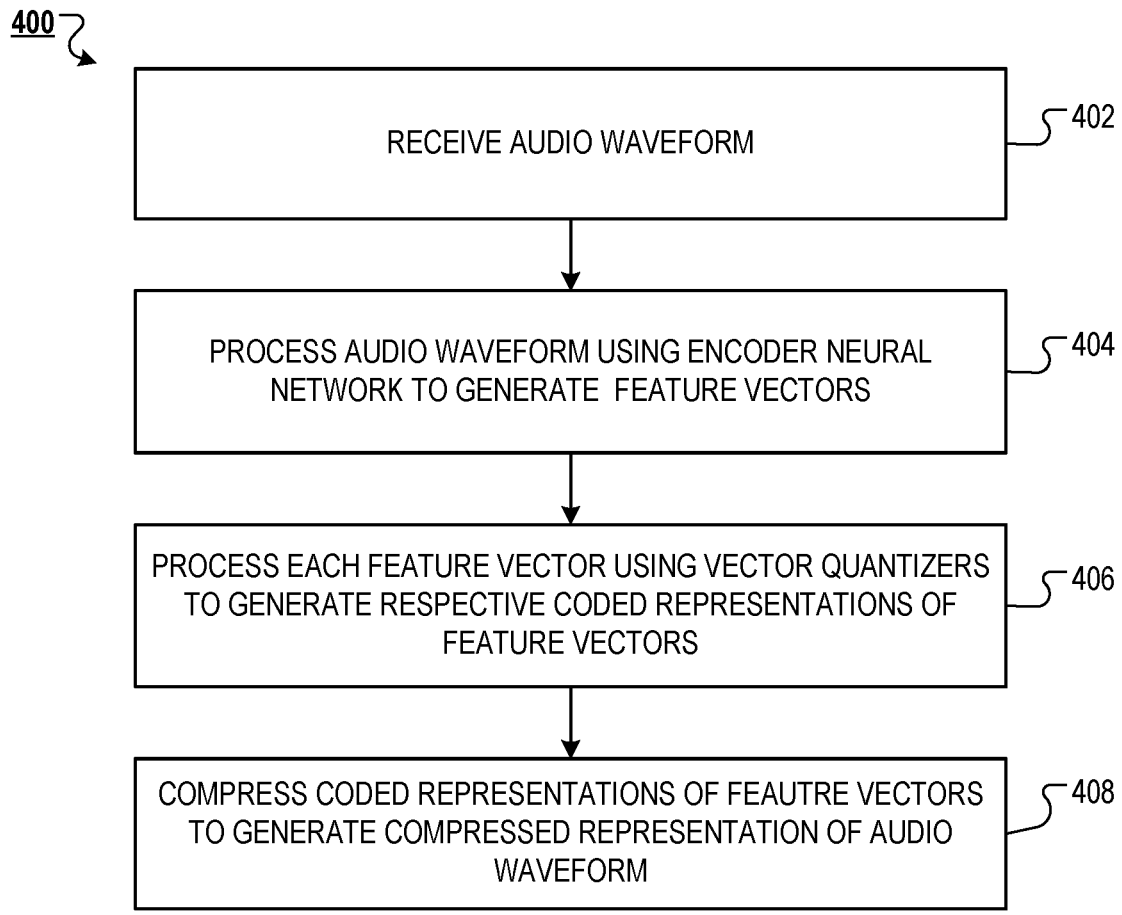
FIG. 4 is a flow diagram of an example process for compressing an audio waveform.

FIG. 4 is a flow diagram of an example process 400 for compressing an audio waveform. For convenience, the process 400 will be described as being performed by a system of one or more computers located in one or more locations. For example, an audio compression system, e.g., the audio compression system 100 of FIG. 1, appropriately programmed in accordance with this specification, can perform the process 400.

The system receives an audio waveform (402). The audio waveform includes a respective audio sample at each of a plurality of time steps. In some cases, the time steps may correspond to a particular sampling rate.

The system processes the audio waveform using an encoder neural network to generate feature vectors (404) representing the audio waveform.

The system processes each feature vector using a plurality of vector quantizers to generate respective coded representations of the feature vectors (406), where each vector quantizer is associated with a respective codebook of code vectors. Each coded representation of a feature vector identifies a plurality of code vectors, including a code vector from the codebook of each vector quantizer, which define a respective quantized representation of the feature vector. In some implementations, the respective quantized representation of the feature vector is defined by a sum of the plurality of code vectors.

The system compresses the coded representations of the feature vectors to generate a compressed representation of the audio waveform (408). In some implementations, the system compresses the coded representations of the feature vectors using entropy encoding.

Figure 5:
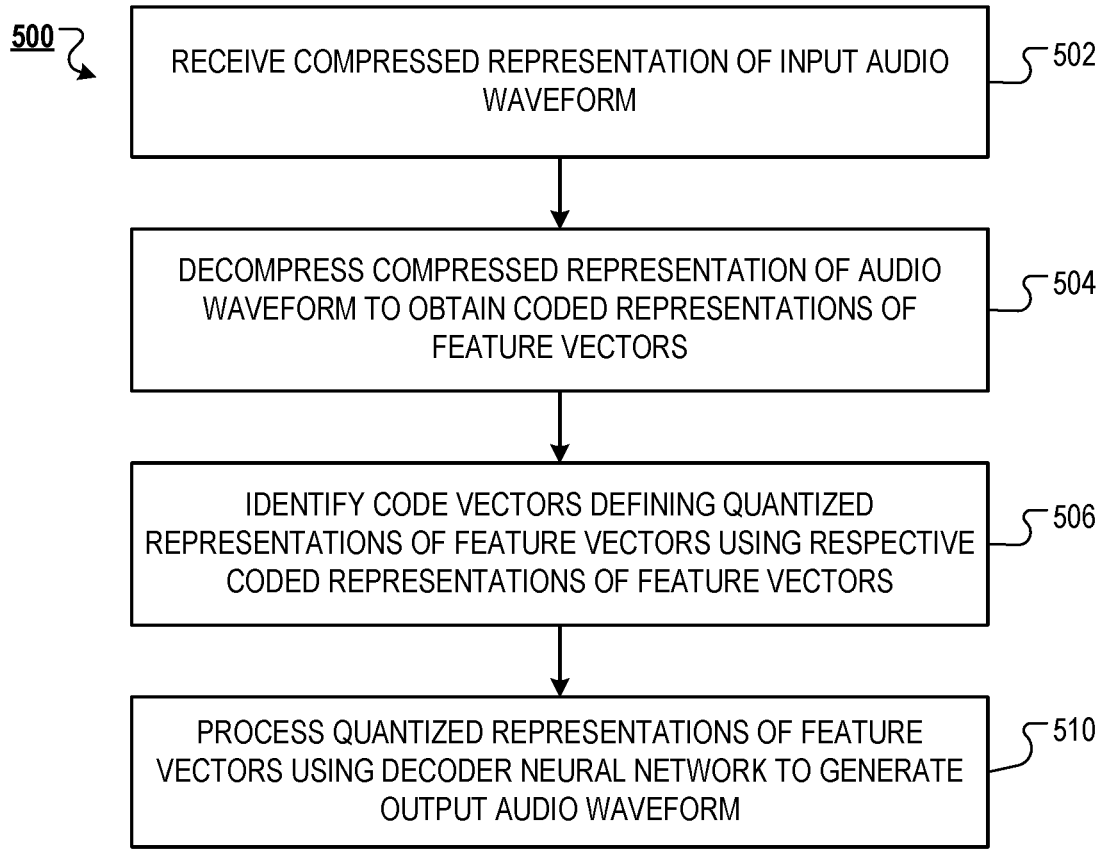
FIG. 5 is a flow diagram of an example process for decompressing a compressed audio waveform.

FIG. 5 is a flow diagram of an example process 500 for decompressing a compressed audio waveform. For convenience, the process 500 will be described as being performed by a system of one or more computers located in one or more locations. For example, an audio decompression system, e.g., the audio decompression system 200 of FIG. 2, appropriately programmed in accordance with this specification, can perform the process 500.

The system receives a compressed representation of an input audio waveform (502).

The system decompresses the compressed representation of the audio waveform to obtain coded representations of feature vectors representing the input audio waveform (504). In some implementations, the system decompresses the compressed representation of the input audio waveform using entropy decoding.

The system identifies, for each coded representation of the feature vectors, a plurality of code vectors, including a code vector from the codebook of each vector quantizer, that define a respective quantized representation of the feature vector (506). In some implementations, the respective quantized representation of the feature vector is defined by a sum of the plurality of code vectors.

The system processes the quantized representations of the feature vectors using a decoder neural network to generate an output audio waveform (510). The output audio waveform may include a respective audio sample at each of a plurality of time steps. In some cases, the time steps may correspond to a particular sampling rate.

Figure 6:
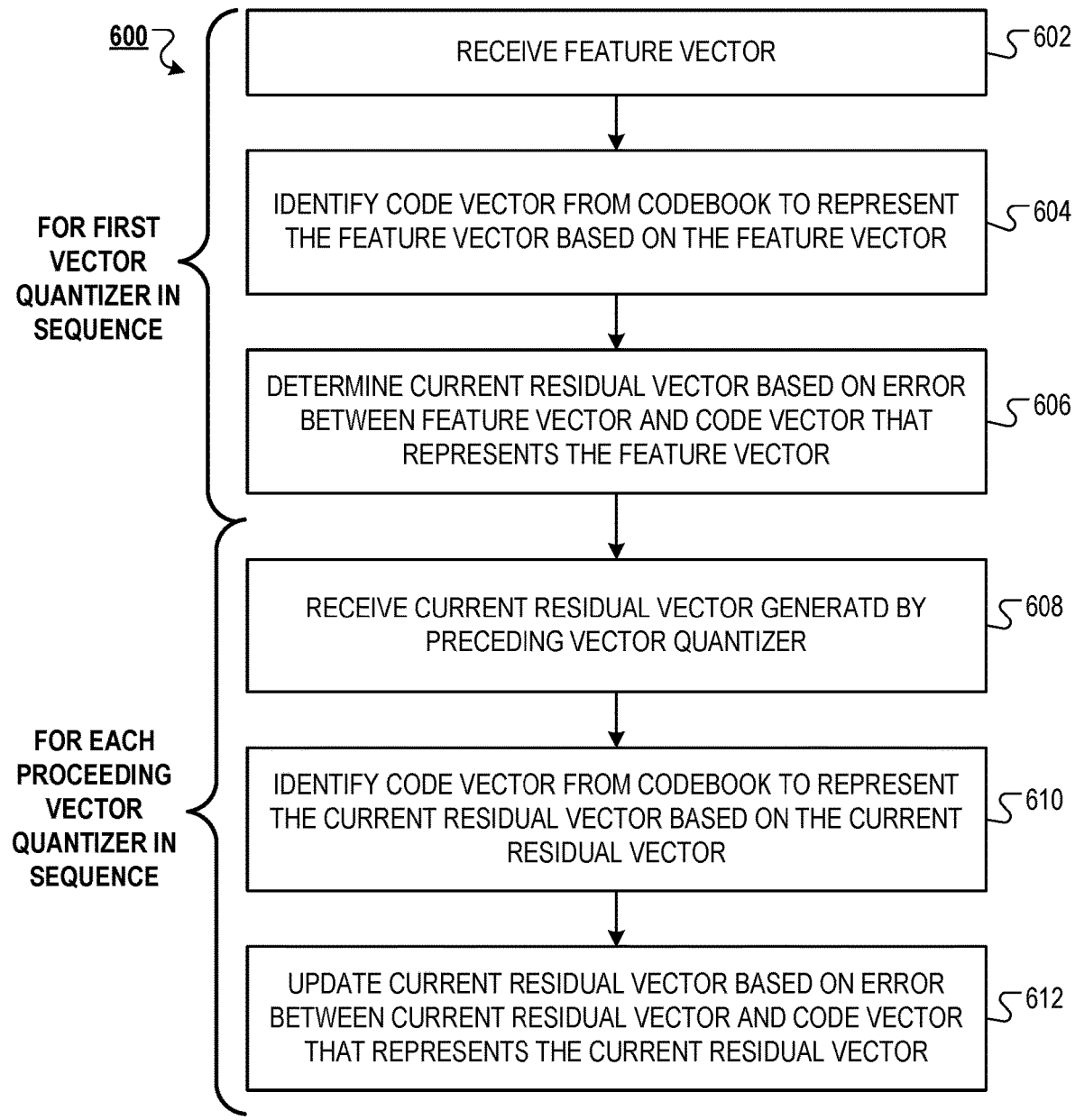
FIG. 6 is a flow diagram of an example process for generating quantized representations of feature vectors using a residual vector quantizer.

FIG. 6 is a flow diagram of an example process 600 for generating quantized representations of feature vectors using a residual vector quantizer. For convenience, the process 600 will be described as being performed by a system of one or more computers located in one or more locations.

The system receives a feature vector at a first vector quantizer in a sequence of vector quantizers (602).

The system identifies, based on the feature vector, a code vector from a codebook of the first vector quantizer in the sequence to represent the feature vector (604). For example, a distance metric (e.g., error) can be computed between the feature vector and each code vector in the codebook. The code vector with the smallest distance metric can be selected to represent the feature vector.

The system determines a current residual vector based on an error between the feature vector and the code vector that represents the feature vector (606). For example, the residual vector can be the difference between the feature vector and the code vector that represents the feature vector. A codeword corresponding to the code vector that represents the feature vector can be stored in a coded representation of the feature vector.

The system receives the current residual vector generated by a preceding vector quantizer in the sequence at a next vector quantizer in the sequence (608).

The system identifies, based on the current residual vector, a code vector from a codebook of the next vector quantizer in the sequence to represent the current residual vector (610). For example, a distance metric (e.g., error) can be computed between the current residual vector and each code vector in the codebook. The code vector with the smallest distance metric can be selected to represent the current residual vector. A codeword corresponding to the code vector that represents the current residual vector can be stored in the coded representation of the feature vector.

The system updates the current residual vector based on an error between the current residual vector and the code vector that represents the current residual vector (612). For example, the current residual vector can be updated by subtracting the code vector that represents the current residual vector from the current residual vector.

Steps 606-612 can be repeated for each remaining vector quantizer in the sequence. The final coded representation of the feature vector contains the codeword of each code vector selected from its respective codebook during the process 600. A quantized representation of the feature vector corresponds to the summation of all code vectors specified by the codewords of the coded representation of the feature vector. In some implementations, the codebooks of the vector quantizers in the sequence include an equal number of code vectors such that each codebook is allocated the same space in memory.

Figure 7:
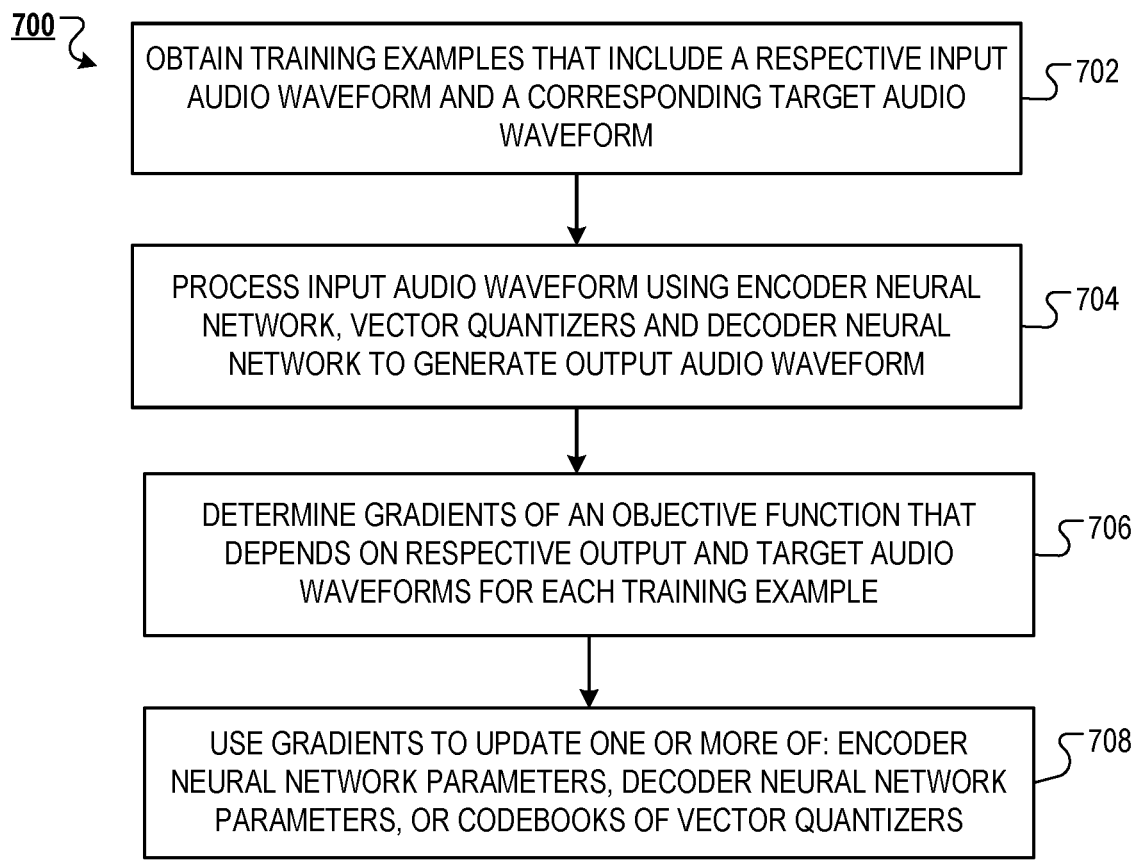
FIG. 7 is a flow diagram of an example process for jointly training an encoder neural network, a decoder neural network and a residual vector quantizer.

FIG. 7 is a flow diagram of an example process 700 for jointly training an encoder neural network, a decoder neural network and a residual vector quantizer. For convenience, the process 700 will be described as being performed by a system of one or more computers located in one or more locations. For example, a training system, e.g., the training system 300 of FIG. 3, appropriately programmed in accordance with this specification, can perform the process 700.

The system obtains training examples that include a respective input audio waveform and a corresponding target audio waveform (702). In some implementations, the target audio waveform of one or more of the training examples can be an enhanced version of the input audio waveform, such as a denoised version of the input audio waveform. The target audio waveform of one or more of the training examples can also be the same as the input audio waveform. Alternatively or in addition, the input audio waveform can be a speech or music waveform.

The system processes the input audio waveform for each training example using an encoder neural network, a plurality of vector quantizers, and a decoder neural network to generate a respective output audio waveform (704), where each vector quantizer is associated with a respective codebook. In some implementations, the encoder and/or decoder neural networks are conditioned on data that defines where the corresponding target audio waveform is the same as the input audio waveform or an enhanced version of the input audio waveform.

The system determines gradients of an objective function, e.g., using backpropagation, that depends on the respective output and target audio waveforms for each training example (706).

The system uses the gradients of the objective function to update one or more of: a set of encoder network parameters, a set of decoder network parameters, or the codebooks of the plurality of vector quantizers (708). For example, the parameters can be updated using an update rule of any appropriate gradient descent optimization technique, e.g., RMSprop, Adam, etc.

FIGS. 8A and 8B show an example of a fully convolutional neural network architecture for the encoder 102 and decoder 104 neural networks. C represents the number of channels and D is the dimensionality of the feature vectors 208. The architecture in FIGS. 8A and 8B is based on the SoundStream model developed by N. Zeghidour, A. Luebs, A. Omran, J. Skoglund and M. Tagliasacchi, "SoundStream: An End-to-End Neural Audio Codec," in *IEEE/ACM Transactions on Audio, Speech, and Language Processing*, vol. 30, pp. 495-507, 2022. This model is an adaptation of the SEANet encoder-decoder network, but without skip connections, designed by Y. Li, M. Tagliasacchi, O. Rybakov, V. Ungureanu and D. Roblek, "Real-Time Speech Frequency Bandwidth Extension," *ICASSP* 2021-2021 *IEEE International Conference on Acoustics, Speech and Signal Processing (ICASSP)*, 2021, pp. 691-695.

The encoder 102 includes a Conv1D layer 802 followed by four EncoderBlocks 804. Each of the blocks includes three ResidualUnits 812, containing dilated convolutions with dilation rates of 1, 3, and 9, respectively, followed by a down-sampling layer in the form of a strided convolution. Internal convolutional layers of EncoderBlocks 804 and ResidualUnits 812 are shown in FIG. 8B. The number of channels is doubled whenever down-sampling. A final Conv1D layer 802 with a kernel of length 3 and a stride of 1 is used to set the dimensionality of the feature vectors 208 to D. A FiLM conditioning layer 806 can also be implemented to process a conditioning signal for use in joint compression and enhancement. The FiLM layer 806 carries out a feature-wise affine transformation on the neural network's feature vectors 208, conditioned on the conditioning signal.

In this case, the decoder 104 effectively mirrors the encoder 102. The DecoderBlocks 810 include a transposed Conv1D layer 814 for up-sampling followed by three ResidualUnits 812. Internal convolutional layers of DecoderBlocks 810 and ResidualUnits 812 are shown in FIG. 8B. The decoder 104 uses the same strides as the encoder 102, but in reverse order, to reconstruct a waveform with the same resolution as the input waveform. The number of channels is halved whenever up-sampling. A final Conv1D layer 802 with one filter, a kernel of size 7 and stride 1 projects the feature vectors 208 back to the waveform 112. A FiLM conditioning layer 806 can also be implemented to process the conditioning signal for joint decompression and enhancement. In some implementations, both the encoder 102 and decoder 104 perform audio enhancement, while in other implementations only one of the encoder 102 or decoder 104 is responsible.

This specification uses the term "configured" in connection with systems and computer program components. For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program, which may also be referred to or described as a program, software, a software application, an app, a module, a software module, a script, or code, can be written in any form of programming language, including compiled or interpreted languages, or declarative or procedural languages; and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

In this specification the term "engine" is used broadly to refer to a software-based system, subsystem, or process that is programmed to perform one or more specific functions. Generally, an engine will be implemented as one or more software modules or components, installed on one or more computers in one or more locations. In some cases, one or more computers will be dedicated to a particular engine; in other cases, multiple engines can be installed and running on the same computer or computers.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone that is running a messaging application, and receiving responsive messages from the user in return.

Data processing apparatus for implementing machine learning models can also include, for example, special-purpose hardware accelerator units for processing common and compute-intensive parts of machine learning training or production, i.e., inference, workloads.

Machine learning models can be implemented and deployed using a machine learning framework, e.g., a TensorFlow framework.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings and recited in the claims in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A method performed by one or more computers, the method comprising:
   receiving an audio waveform that comprises a respective audio sample for each of a plurality of time steps;
   processing the audio waveform using an encoder neural network to generate a plurality of feature vectors representing the audio waveform;
   generating a respective coded representation of each of the plurality of feature vectors using a plurality of vector quantizers that are each associated with a respective codebook of code vectors, wherein the respective coded representation of each feature vector identifies a plurality of code vectors, including a respective code vector from the codebook of each vector quantizer, that define a quantized representation of the feature vector, wherein the plurality of vector quantizers are ordered in a sequence, and wherein for each of the plurality of feature vectors, generating the coded representation of the feature vector comprises:
      for a first vector quantizer in the sequence of vector quantizers:
         receiving the feature vector;
         identifying, based on the feature vector, a respective code vector from the codebook of the vector quantizer to represent the feature vector; and determining a current residual vector based on an error between: (i) the feature vector, and (ii) the code vector that represents the feature vector,
wherein the coded representation of the feature vector identifies the code vector that represents the feature vector; and
generating a compressed representation of the audio waveform by compressing the respective coded representation of each of the plurality of feature vectors.

2. The method of claim 1, wherein for each of the plurality of feature vectors, generating the coded representation of the feature vector further comprises:
for each vector quantizer after the first vector quantizer in the sequence of vector quantizers:
receiving a current residual vector generated by a preceding vector quantizer in the sequence of vector quantizers;
identifying, based on the current residual vector, a respective code vector from the codebook of the vector quantizer to represent the current residual vector; and
if the vector quantizer is not a last vector quantizer in the sequence of vector quantizers:
updating the current residual vector based on an error between: (i) the current residual vector, and (ii) the code vector that represents the current residual vector;
wherein the coded representation of the feature vector identifies the code vector that represents the current residual vector.

3. The method of claim 1, wherein generating the compressed representation of the audio waveform comprises:
entropy encoding the respective coded representation of each of the plurality of feature vectors.

4. The method of claim 1, wherein the respective quantized representation of each feature vector is defined by a sum of the plurality of code vectors identified by the coded representation of the feature vector.

5. The method of claim 1, wherein the codebooks of the plurality of vector quantizers all include an equal number of code vectors.

6. The method of claim 1, wherein the encoder neural network and the codebooks of the plurality of vector quantizers are jointly trained along with a decoder neural network, wherein the decoder neural network is configured to:
receive a respective quantized representation of each of a plurality of feature vectors representing an input audio waveform that are generated using the encoder neural network and the plurality of vector quantizers; and
process the quantized representations of the feature vectors representing the input audio waveform to generate an output audio waveform.

7. The method of claim 6, wherein the training comprises:
obtaining a plurality of training examples that each include: (i) a respective input audio waveform, and (ii) a corresponding target audio waveform;
processing the respective input audio waveform from each training example using the encoder neural network, a plurality of vector quantizers from the sequence of vector quantizers, and the decoder neural network to generate an output audio waveform that is an estimate of the corresponding target audio waveform;
determining gradients of an objective function that depends on the respective output and target waveforms for each training example; and
using the gradients of the objective function to update one or more of: a set of encoder neural network parameters, a set of decoder neural network parameters, or the codebooks of the plurality of vector quantizers.

8. The method of claim 7, wherein for one or more of the training examples, the target audio waveform is an enhanced version of the input audio waveform.

9. The method of claim 8, wherein for one or more of the training examples, the target audio waveform is a de-noised version of the input audio waveform.

10. The method of claim 8, wherein for one or more of the training examples, the target audio waveform is the same as the input audio waveform.

11. The method of claim 10, wherein processing each input audio waveform to generate the corresponding output audio waveform comprises:
conditioning the encoder neural network, the decoder neural network, or both, on data that defines whether the corresponding target audio waveform is: (i) the input audio waveform or (ii) an enhanced version of the input audio waveform.

12. The method of claim 7, further comprising, for each training example:
selecting a respective number of vector quantizers to be used in quantizing feature vectors representing the input audio waveform; and
generating the corresponding output audio waveform using only the selected number of vector quantizers from the sequence of vector quantizers.

13. The method of claim 12, wherein the selected number of vector quantizers to be used in quantizing feature vectors representing input audio waveforms varies between training examples.

14. The method of claim 12, wherein for each training example, selecting the respective number of vector quantizers to be used in quantizing feature vectors representing the input audio waveform comprises:
randomly sampling the number of vector quantizers to be used in quantizing feature vectors representing the input audio waveform.

15. The method of claim 7, wherein the objective function comprises a reconstruction loss that, for each training example, measures an error between: (i) the output audio waveform, and (ii) the corresponding target audio waveform.

16. The method of claim 15, wherein for each training example, the reconstruction loss measures a multi-scale spectral error between: (i) the output audio waveform, and (ii) the corresponding target audio waveform.

17. The method of claim 7, wherein the training further comprises, for each training example:
processing data derived from the output audio waveform using a discriminator neural network to generate a set of one or more discriminator scores, wherein each discriminator score characterizes an estimated likelihood that the output audio waveform is an audio waveform that was generated using the encoder neural network, the plurality of vector quantizers, and the decoder neural network;
wherein the objective function comprises an adversarial loss that depends on the discriminator scores generated by the discriminator neural network.

18. A system comprising:
one or more computers; and
one or more storage devices communicatively coupled to the one or more computers, wherein the one or more storage devices store instructions that, when executed by the one or more computers, cause the one or more computers to perform operations comprising:

receiving an audio waveform that comprises a respective audio sample for each of a plurality of time steps;

processing the audio waveform using an encoder neural network to generate a plurality of feature vectors representing the audio waveform;

generating a respective coded representation of each of the plurality of feature vectors using a plurality of vector quantizers that are each associated with a respective codebook of code vectors, wherein the respective coded representation of each feature vector identifies a plurality of code vectors, including a respective code vector from the codebook of each vector quantizer, that define a quantized representation of the feature vector, wherein the plurality of vector quantizers are ordered in a sequence, and wherein for each of the plurality of feature vectors, generating the coded representation of the feature vector comprises:

for a first vector quantizer in the sequence of vector quantizers:
receiving the feature vector;
identifying, based on the feature vector, a respective code vector from the codebook of the vector quantizer to represent the feature vector; and
determining a current residual vector based on an error between: (i) the feature vector, and (ii) the code vector that represents the feature vector, wherein the coded representation of the feature vector identifies the code vector that represents the feature vector; and generating a compressed representation of the audio waveform by compressing the respective coded representation of each of the plurality of feature vectors.

19. One or more non-transitory computer storage media storing instructions that when executed by one or more computers cause the one or more computers to perform operations comprising:

receiving an audio waveform that comprises a respective audio sample for each of a plurality of time steps;

processing the audio waveform using an encoder neural network to generate a plurality of feature vectors representing the audio waveform;

generating a respective coded representation of each of the plurality of feature vectors using a plurality of vector quantizers that are each associated with a respective codebook of code vectors, wherein the respective coded representation of each feature vector identifies a plurality of code vectors, including a respective code vector from the codebook of each vector quantizer, that define a quantized representation of the feature vector, wherein the plurality of vector quantizers are ordered in a sequence, and wherein for each of the plurality of feature vectors, generating the coded representation of the feature vector comprises:

for a first vector quantizer in the sequence of vector quantizers:
receiving the feature vector;
identifying, based on the feature vector, a respective code vector from the codebook of the vector quantizer to represent the feature vector; and
determining a current residual vector based on an error between: (i) the feature vector, and (ii) the code vector that represents the feature vector, wherein the coded representation of the feature vector identifies the code vector that represents the feature vector; and generating a compressed representation of the audio waveform by compressing the respective coded representation of each of the plurality of feature vectors.

20. A method performed by one or more computers, the method comprising:

receiving an audio waveform that comprises a respective audio sample for each of a plurality of time steps;

processing the audio waveform using an encoder neural network to generate a plurality of feature vectors representing the audio waveform;

generating a respective coded representation of each of the plurality of feature vectors using a plurality of vector quantizers that are each associated with a respective codebook of code vectors, wherein the respective coded representation of each feature vector identifies a plurality of code vectors, including a respective code vector from the codebook of each vector quantizer, that define a quantized representation of the feature vector; and generating a compressed representation of the audio waveform by compressing the respective coded representation of each of the plurality of feature vectors, wherein the encoder neural network and the codebooks of the plurality of vector quantizers are jointly trained along with a decoder neural network, and wherein the decoder neural network is configured to:

receive a respective quantized representation of each of a plurality of feature vectors representing an input audio waveform that are generated using the encoder neural network and the plurality of vector quantizers; and process the quantized representations of the feature vectors representing the input audio waveform to generate an output audio waveform, and wherein the training comprises:

obtaining a plurality of training examples that each include: (i) a respective input audio waveform, and (ii) a corresponding target audio waveform;

processing the respective input audio waveform from each training example using the encoder neural network, a plurality of vector quantizers from a sequence of vector quantizers, and the decoder neural network to generate an output audio waveform that is an estimate of the corresponding target audio waveform;

determining gradients of an objective function that depends on the respective output and target waveforms for each training example; and using the gradients of the objective function to update one or more of: a set of encoder neural network parameters, a set of decoder neural network parameters, or the codebooks of the plurality of vector quantizers.

* * * * *